(12) United States Patent
Hougham et al.

(10) Patent No.: US 7,823,278 B2
(45) Date of Patent: Nov. 2, 2010

(54) METHOD FOR FABRICATING ELECTRICAL CONTACT BUTTONS

(75) Inventors: Gareth G Hougham, Ossining, NY (US); Keith E Fogel, Nanuet, NY (US); Joanna Rosner, Cortlandt Manor, NY (US); Paul A Lauro, Brewster, NY (US); Sherif Goma, Hawthorne, NY (US); Joseph Zinter, Jr., Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 487 days.

(21) Appl. No.: 11/220,324

(22) Filed: Sep. 6, 2005

(65) Prior Publication Data

US 2006/0009050 A1      Jan. 12, 2006

Related U.S. Application Data

(62) Division of application No. 10/715,288, filed on Nov. 17, 2003, now Pat. No. 7,137,827.

(51) Int. Cl.
*H05K 3/02* (2006.01)

(52) U.S. Cl. .............................. 29/846; 29/842; 29/844; 29/874; 29/884

(58) Field of Classification Search .................. 29/846, 29/842, 844, 848, 874, 883, 884; 257/E23.067, 257/E23.086; 439/66, 71, 74, 86
See application file for complete search history.

(56) References Cited

U.S. PATENT DOCUMENTS

| | | | |
|---|---|---|---|
| 3,783,433 A | 1/1974 | Kurtz et al. ................... 439/82 |
| 4,029,375 A | 6/1977 | Gabrielian .................... 439/66 |
| 4,070,077 A | 1/1978 | Clark .......................... 439/876 |
| 4,175,810 A | 11/1979 | Holt et al. ..................... 439/82 |
| 4,181,385 A | 1/1980 | DeSantis et al. .............. 439/83 |
| 4,381,134 A | 4/1983 | Anselmo et al. ............. 439/444 |
| 4,443,756 A | 4/1984 | Lightbody et al. .......... 324/761 |
| 4,505,529 A | 3/1985 | Barkus ........................ 439/82 |
| 4,528,072 A | 7/1985 | Kurosawa et al. ............. 29/830 |
| 4,528,500 A | 7/1985 | Lightbody et al. .......... 324/537 |
| 4,724,383 A | 2/1988 | Hart ............................ 324/754 |
| 4,902,606 A | 2/1990 | Patraw ........................ 430/314 |
| 4,904,935 A | 2/1990 | Calma et al. ................. 324/754 |
| 4,961,709 A | 10/1990 | Noschese ..................... 439/66 |
| 5,038,467 A | 8/1991 | Murphy ....................... 29/845 |
| 5,174,763 A | 12/1992 | Wilson ........................ 439/66 |
| 5,366,380 A | 11/1994 | Reymond .................... 439/66 |
| 5,380,210 A | 1/1995 | Grabbe et al. ................ 439/66 |

(Continued)

FOREIGN PATENT DOCUMENTS

JP     2002-513510     5/2002

*Primary Examiner*—Thiem Phan
(74) *Attorney, Agent, or Firm*—Ohlandt, Greeley, Ruggiero & Perle, LLP; Daniel P. Morris, IBM Attorney

(57) ABSTRACT

An interposer having one or more hollow electrical contact buttons disposed in a carrier. The interposer is formed by disposing sacrificial posts in vias of the carrier. The electrical contact buttons are formed on the sacrificial posts by a metallizing process in desired pattern using a mask. The sacrificial posts are made of a material that thermally decomposes upon application of heat without altering the carrier or the electrical contact buttons.

21 Claims, 22 Drawing Sheets

U.S. PATENT DOCUMENTS

| | | | |
|---|---|---|---|
| 5,388,998 A | 2/1995 | Grange et al. | 439/66 |
| 5,562,462 A | 10/1996 | Matsuba et al. | 439/70 |
| 5,738,531 A | 4/1998 | Beaman et al. | 439/71 |
| 5,924,875 A | 7/1999 | Tighe et al. | 439/74 |
| 5,971,253 A | 10/1999 | Gilleo et al. | 228/180.22 |
| 6,007,349 A | 12/1999 | DiStefano et al. | 439/71 |
| 6,046,597 A | 4/2000 | Barabi | 324/755 |
| 6,264,476 B1 | 7/2001 | Li et al. | 439/66 |
| 6,274,820 B1 | 8/2001 | DiStefano et al. | 174/254 |
| 6,833,520 B1 * | 12/2004 | Wong et al. | 200/182 |
| 2002/0127893 A1 | 9/2002 | Brodsky | 439/66 |
| 2003/0139071 A1 | 7/2003 | Li et al. | 439/66 |
| 2004/0110401 A1 | 6/2004 | DelPrete et al. | 439/91 |

* cited by examiner

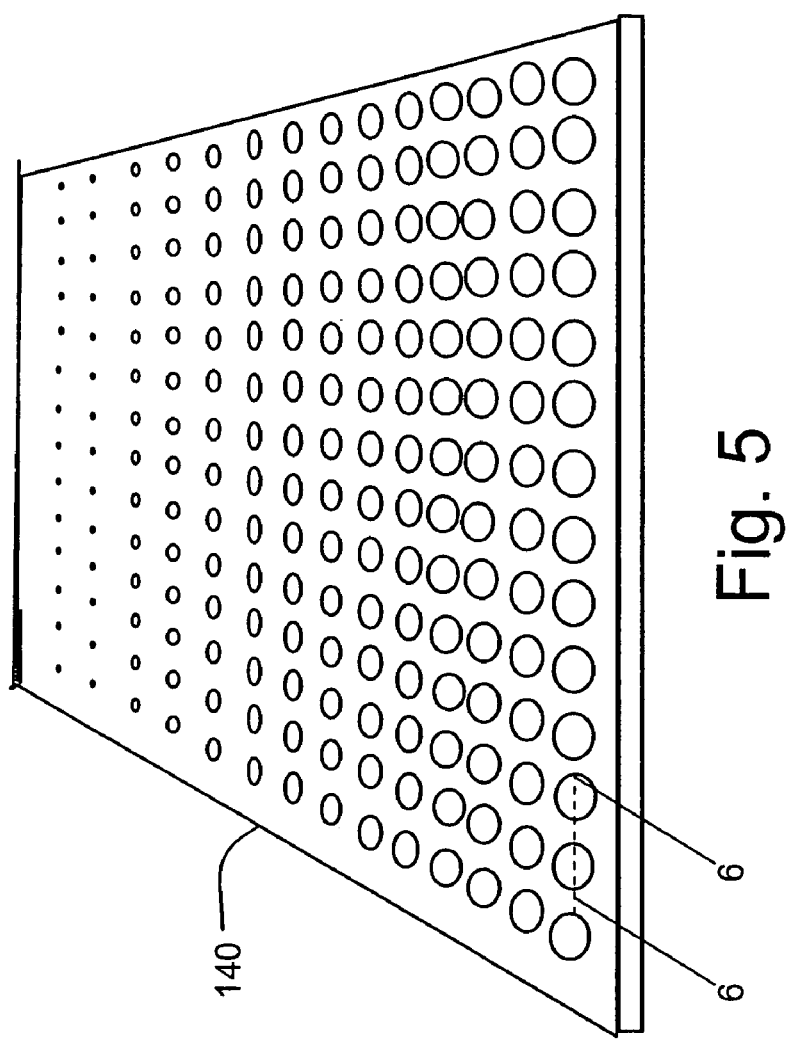
Fig. 5
Fig. 6

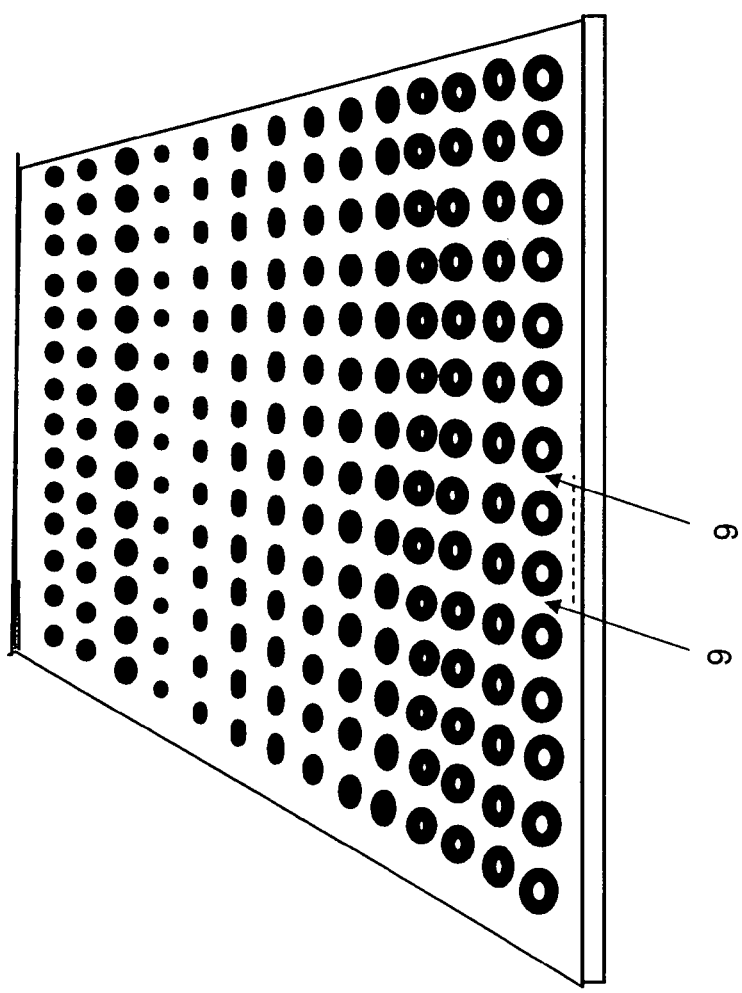
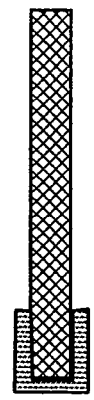
Fig. 8
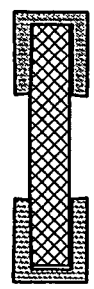
Fig. 9

Fig. 21 Method 2

Method 3

Method 4

Fig. 24 Method 5

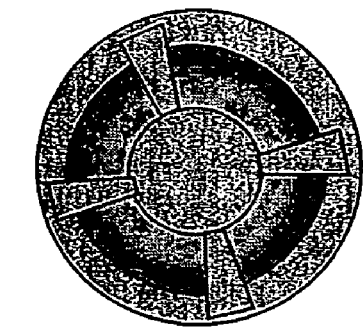
25D
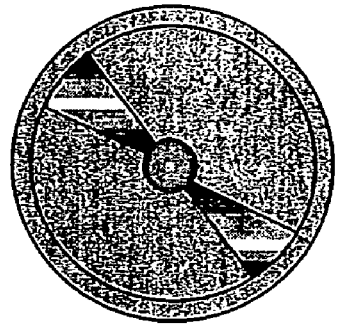
25H
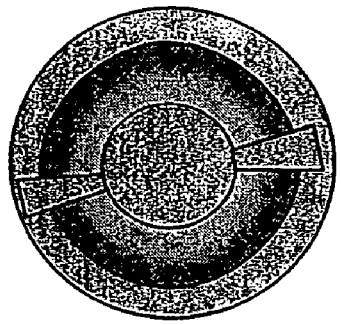
25C
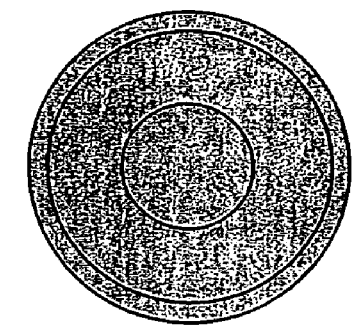
25G
Full Metal cap
25B
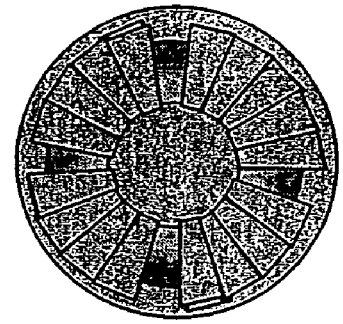
25F
25A
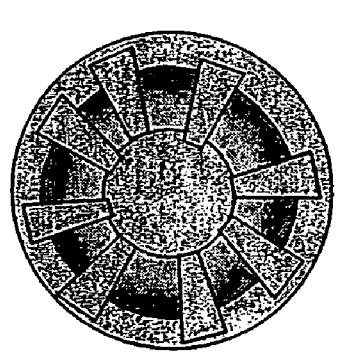
25E
Fig. 25

US 7,823,278 B2

METHOD FOR FABRICATING ELECTRICAL CONTACT BUTTONS

This application is a division of U.S. patent application Ser. No. 10/715,288, filed on Nov. 17, 2003 now U.S. Pat. No. 7,137,827 for Interposer With Electrical Contact Button And Method.

FIELD OF THE INVENTION

This invention relates to an interposer with electrical contact buttons and a method for making the electrical contact buttons and the interposer.

BACKGROUND OF THE INVENTION

Land Grid Array (LGA) interposers provide an array of interconnections between a printed wiring board (PWB) and a chip module, such as a Multi-Chip Module (MCM). LGA interposers allow connections to be made in a way that are reversible and that do not require soldering as, for example, in ball grid arrays and column grid arrays. Ball grid arrays are unreliable on large areas because the lateral thermal coefficient of expansion driven stresses that develop exceed the ball grid array strength. Column grid arrays hold together despite the stresses but are soldered solutions and, thus, do not allow field replacability of the chip modules. Field replacability is important because it saves the customer significant cost in maintenance and upgrade of high-end computers for which LGAs are typically used.

Currently, there are at least two LGA types commercially available. Each suffers from serious problems. One type utilizes as the conducting medium a composite of siloxane elastomer and silver particles, which when mixed above the percolation threshold concentration, conducts electricity. The composite is injection molded into the shape of buttons across a full LGA in one injection mold operation, and is, thus, a good solution from the standpoint of manufacturing the LGA cost-effectively. Another advantage is that it can operate at low contact forces on the order of 30 to 80 grams per contact. Typically, current LGA's have several thousand contacts per interposer. A disadvantage is that the composite of elastomer and silver particles is itself a poor elastomer. In other words it undergoes significant plastic deformation under typical operating conditions and leads to eventual failure.

Another type of LGA interposer consists of an area array of button contacts each made of a random spaghetti coil spring. These springs are formed one at a time by injecting at high speed a length of gold-coated molybdenum wire into a mold. This interposer works reliably. However, they have a disadvantage of being expensive because of the button-by-button fabrication method. Also, they require being squeezed with a very high contact force between the MCM and the PWB. Forces on the order of 100 to 120 grams per button are typically required. Such high forces, once multiplied by the large number of buttons on an interposer, can cause deformation of the MCM and the PWB, and have been known to crack the chips mounted on the MCM. Further, these interposers do not scale reliably to larger MCMs with higher input/output (I/O) requirements. In addition, these interposers are also inconsistent with the introduction of organic packaging. Organic packages strive to replace expensive ceramic MCMs and offer better electric performance. Organic packages are much softer and more fragile and could thus only tolerate LGA forces much smaller than 100 to 200 grams per button.

SUMMARY OF THE INVENTION

An interposer embodiment of the present invention comprises a hollow body of electrically conductive material disposed in an electrically insulating carrier.

In a second interposer embodiment of the present invention in which the interposer connects a module to a printing wiring board, the interposer comprises a carrier that has at least one electrically conductive via and that is disposed so that the via is in registration with a connector of the module and a connector of the printed wiring board. At least one hollow electrical contact button is disposed in the via for electrical contact with the connector of the module and the connector of the printed wiring board.

In one variation of the above noted interposer embodiments, the hollow body comprises no voids. In a second variation, the hollow body comprises one or more voids. In a third variation, the hollow body comprises at least two voids in registration with one another and disposed on opposite sides of the carrier.

A method embodiment of the present invention fabricates an electrical contact button by forming a sacrificial post, forming a pattern of electrically conductive material on the sacrificial post and removing the sacrificial post, thereby providing the electrical contact button.

Preferably, the electrically conductive material is selected from the group consisting of: copper, nickel, gold, chromium, titanium, lead, tin, bismuth, antimony, tungsten, molybdenum and alloys thereof.

In alternate embodiments of the method, the pattern of electrically conductive material is formed on the sacrificial post by a process selected from the group that consists of: physical masking and photoresist. The physical masking process may be selected from the group of vacuum deposition and electroless plating.

The photoresist process may be selected from the group of metal additive and metal subtractive. The photoresist process may place metal on the sacrificial post by vacuum deposition, sputtering, electroless plating, laminating foil or preformed sheet metal.

Preferably, the sacrificial post is formed of a material that thermally decomposes and vaporizes. The sacrificial post material may be selected from the group of polymethylmethacrylate, polyalpha-methylstyrene, polyethyleneoxide, polyphenylene oxide or polystyrene and other materials that are known to burn off, vaporize depolymerize, or other wise vacate the original position.

Preferably the sacrificial post is removed by thermal decomposition.

The electrically conductive pattern is continuous in some embodiments and discontinuous in other embodiments. For example, the discontinuous pattern comprises one or more voids.

In a second embodiment of the method of the present invention, the sacrificial post is formed in a carrier. Preferably, the carrier is formed of an electrically insulating material, which may be selected from the group consisting of: polyimide, polyester, ceramic, quartz, glass, polymer coated metal, polytetrafluoroethylene and oxides.

In a third embodiment of the method of the present invention, the carrier includes a plurality of perforations in which a plurality of the sacrificial posts are formed, wherein a pattern of the electrically conductive material is formed on each of the sacrificial posts, and wherein the sacrificial posts are removed to thereby form a plurality of electrical contact buttons.

Preferably, a coating of electrically conductive material is formed on at least one of the perforations before the sacrificial posts are formed to complete the electrical connection between the top of the contact and the bottom.

Preferably, the sacrificial posts are formed in the perforations by injection molding.

Preferably, the carrier is formed of an electrically insulating material, which may be selected from the group that consists of: polyimide, polyester, ceramic, quartz, glass, polymer coated metal, polytetrafluoroethylene and oxides.

Preferably, the electrically conductive material is selected from the group consisting of: copper, nickel, gold, chromium, titanium, lead, tin, bismuth, antimony, tungsten, molybdenum and alloys thereof.

In variations of the third embodiment, the pattern of electrically conductive material is formed on the sacrificial posts by a process selected from the group that consists of: physical masking and photoresist. The photoresist process may be either metal additive or metal subtractive. Either the physical masking process or the photoresist process may use either vacuum deposition or electroless plating.

Preferably, the sacrificial posts are removed by thermal decomposition and are formed of a material that thermally decomposes and vaporizes. The sacrificial post material may be selected from the group consisting of: polymethylmethacrylate, polyalpha-methylstyrene, polyethyleneoxide, polyphenylene oxide or polystyrene and other materials that are known to burn off, vaporize depolymerize, or other wise vacate the original position.

The electrically conductive pattern is continuous in some embodiments and discontinuous in other embodiments. That is the discontinuous pattern comprises one or more voids.

BRIEF DESCRIPTION OF THE DRAWINGS

Other and further objects, advantages and features of the present invention will be understood by reference to the following specification in conjunction with the accompanying drawings, in which like reference characters denote like elements of structure and:

FIG. 5 is a perspective view of an empty carrier before metallization of through holes that is common to all six methods of FIG. 4;

FIG. 6 is a cross-sectional view taken along line 6-6 of FIG. 5;

FIG. 8 is a perspective view of a carrier with metallized through holes that is common to the first six methods of FIG. 4;

FIG. 9 is a cross-sectional view taken along line 9-9 of FIG. 8;

FIG. 25 shows exemplary patterns of metallized sacrificial posts before the post removal step;

DESCRIPTION OF THE PREFERRED EMBODIMENT

Figure 1:
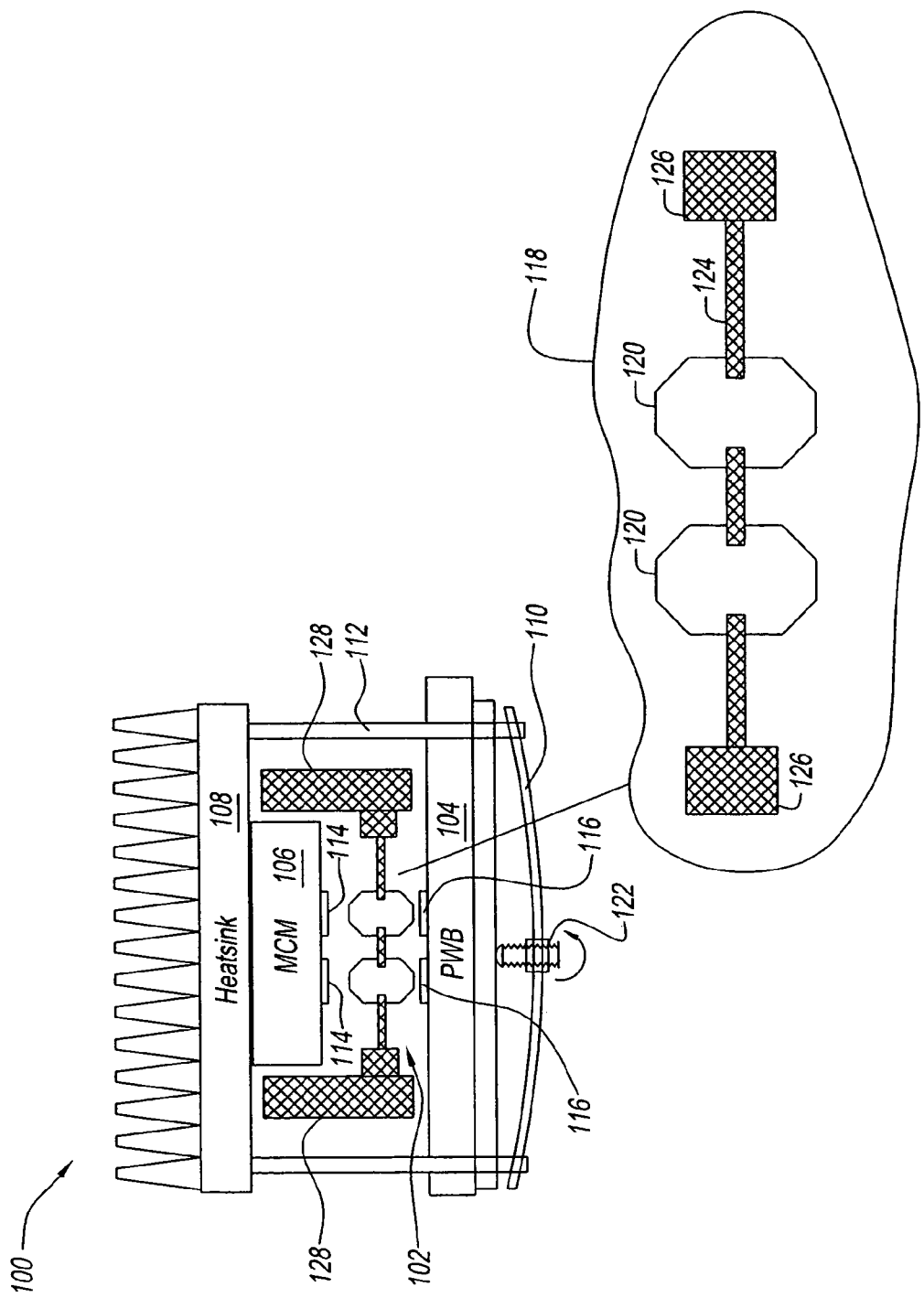
FIG. 1 is an assembly in which the LGA interposer of the present invention may be used.

Referring to FIG. 1, an assembly 100 includes an LGA interposer 102 disposed between a PWB 104 and an MCM module 106, a heat sink 108, a spring 110 and posts 112. PWB 104, MCM module 106 and heat sink 108 are held together under force supplied by spring 110, transferred through posts 112, posts 112 being attached to heat sink 108. Posts 112 are preferably metallic.

MCM module 106 includes one or more electrical contacts 114 and PWB 104 includes one or more electrical contacts 116 disposed in aligned and spaced relationship to contacts 114. LGA interposer 102, which is shown in an exploded view at detail 118, includes one or more electrical contact buttons 120 disposed in aligned relationship to contacts 114 and 116.

When spring 110 is adjusted by means of adjuster 122, PWB 104, LGA interposer 102 and MCM module 106 are pressed toward one another so that contacts 114 of MCM module 106 and contacts 116 of PWB 104 make a forced physical and electrical contact with respective ones of contacts 120 of LGA interposer 102.

LGA interposer 102 includes a carrier 124 having one or more through holes or vias in which contact buttons 120 are disposed. Carrier 124 is disposed between physical downstops 126, which are affixed to an LGA frame 128. LGA frame 128 provides a stop limit to the amount of compression that spring 110 can exert in bringing contacts 114, contacts 116 and contact buttons 120 into physical and electrical contact.

It will be apparent to those skilled in the art that although two contacts 114, two contacts 116 and two contact buttons 120 are shown, more or less of each may be provided. It will also be apparent to those skilled in the art that assembly 100 can include LGA interposer 102 disposed between any two devices having contacts that need connections, MCM module 106 and PWB being shown by way of example.

Figure 26:
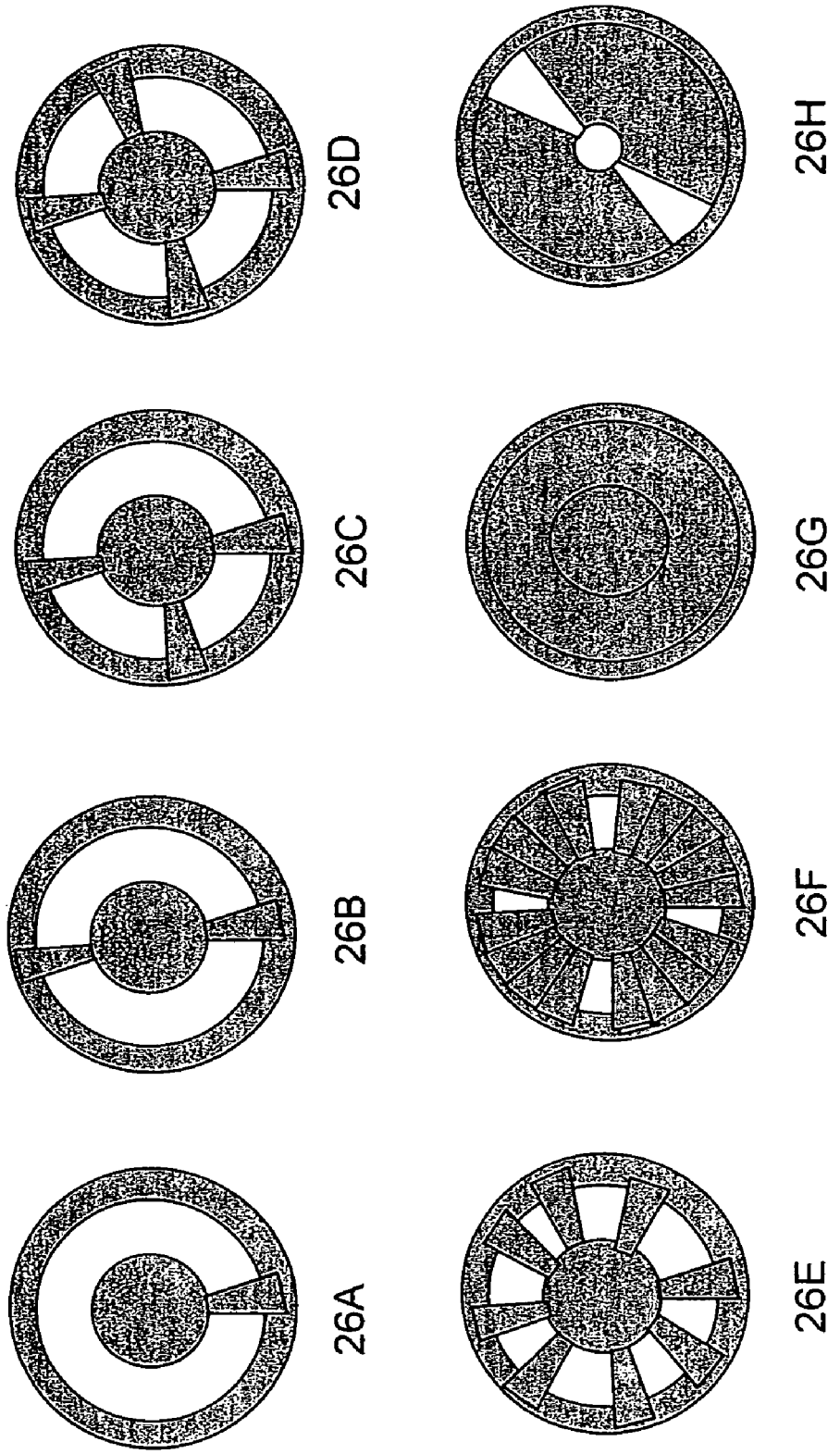
FIG. 26 shows the exemplary patterns of FIG. 25 after the post removal step.
Figure 27:
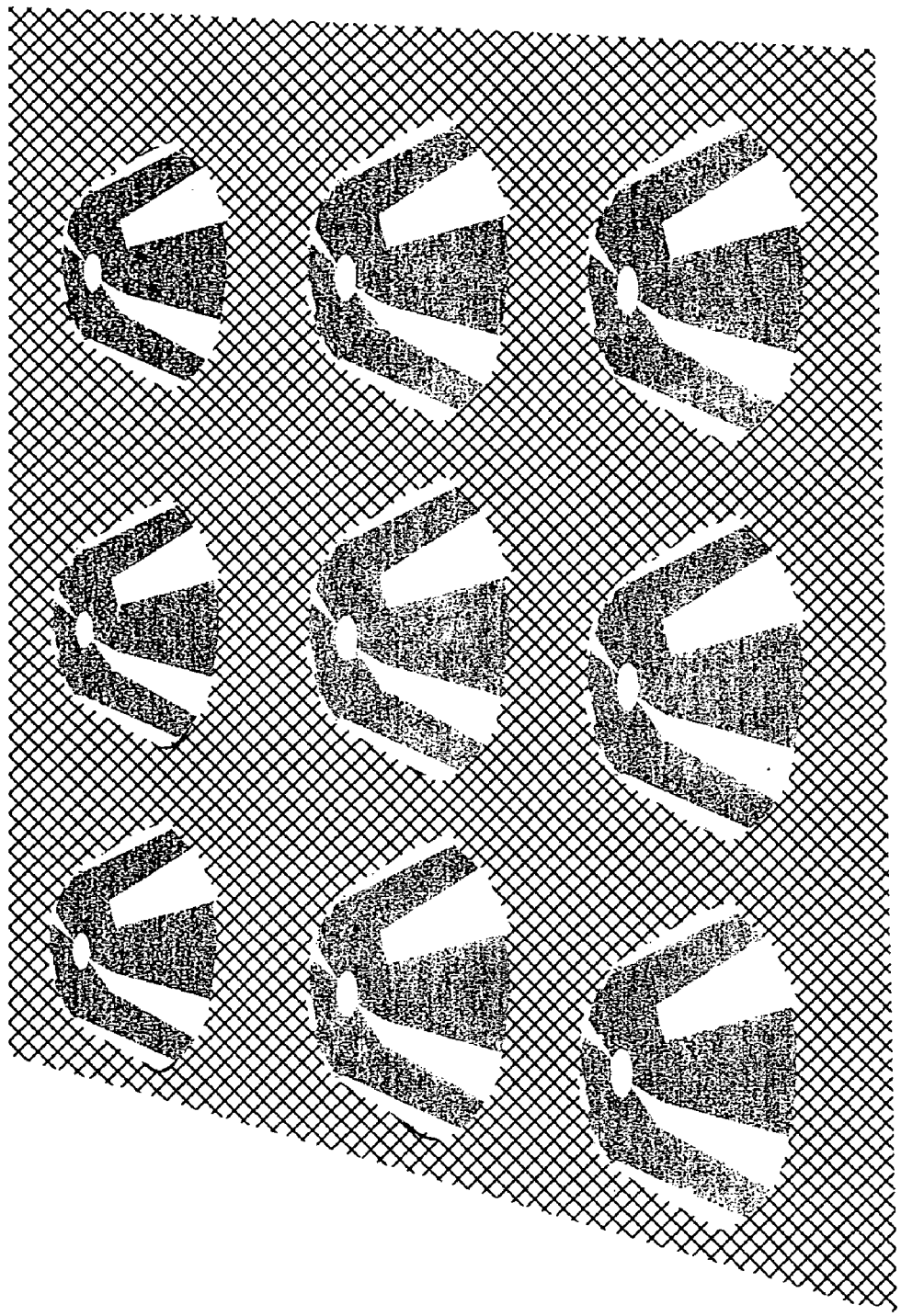
FIG. 27 is a perspective view of the LGA interposer with an exemplary metallized button pattern of the present invention.

Preferably, contact buttons 120 are made according to the methods of the present invention and can have any of a variety of metallization patterns, for example any of those shown in FIG. 26.

Figure 7:
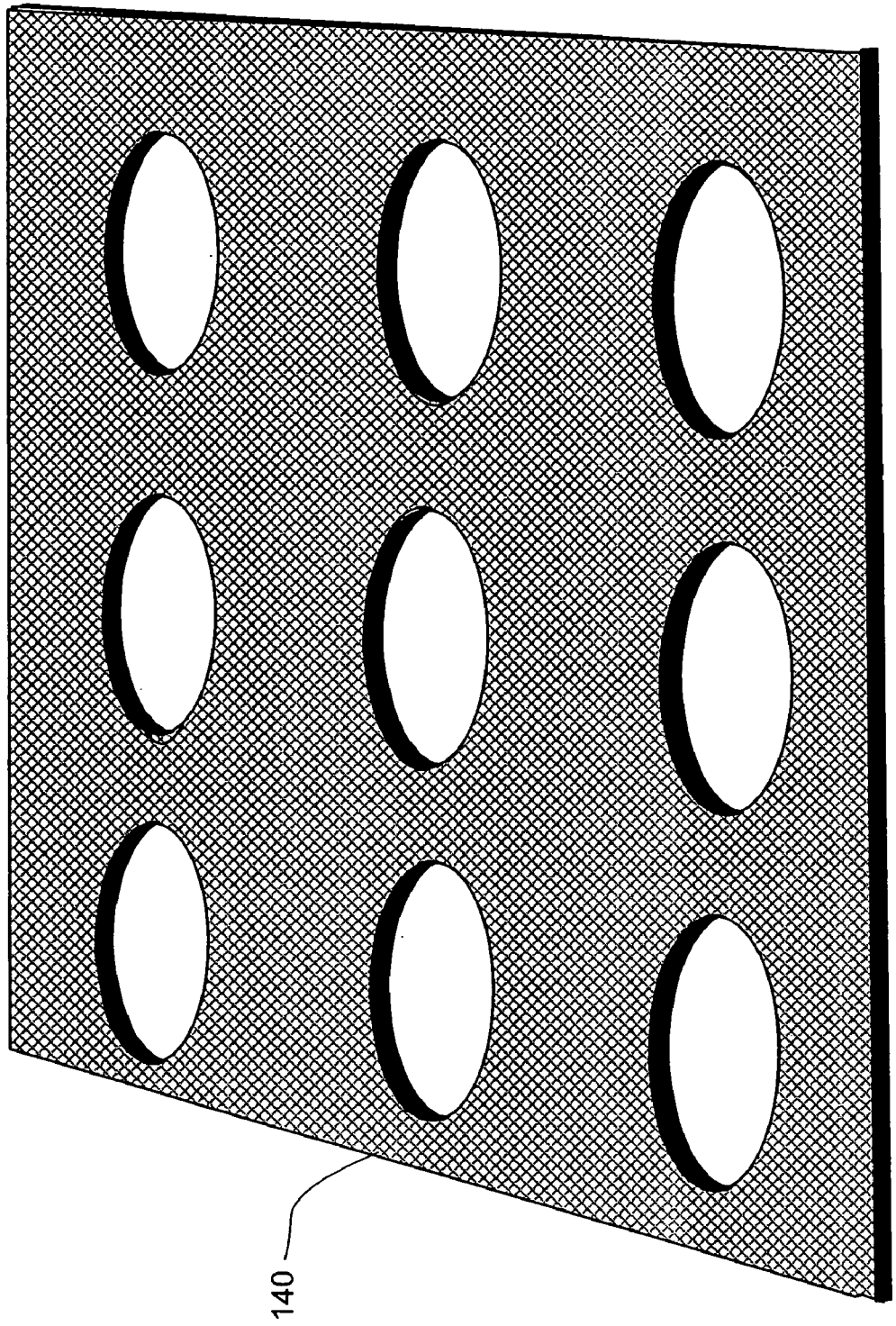
FIG. 7 is a perspective view of an empty carrier before metallization of through holes that is common to the first six methods of FIG. 4.

According to the method of the present invention, LGA interposer 102 is made by starting with a perforated carrier 140 or 142, as shown in FIGS. 5 and 7. Carrier 140 is fabricated by perforating a Kapton plastic sheet with holes (vias) in the desired positions of contacts.

Carrier 140 is preferably an electrically insulating material that may be either a flexible sheet or a more rigid plate. The electrically insulating material, for example, may be polyimide, polyester, ceramic, quartz, glass, polymer coated metal, polytetrafluoroethylene, oxides or the like. Another type of carrier that could be used is a low expansion metal or metal alloy which has an insulator layer over it's entire surface and through the vias. An example of the latter could be molybdenum with low expansion coefficient with a thin coating of low expansion polymer such as pyrromellitic dianhydrideheneylene diamine (PMDA-PDA) polyimide. Then the interposer construction would proceed as described herein.

Metal pads must be fabricated on each side of the holes and connected in a manner that is electrically continuous through the hole. Two main approaches to this are a direct metallization using physical masks to shield areas where metal is not desired and a subtractive method for defining this metallurgy. In the subtractive method, metal is first deposited on both sides and through the vias of the planar substrate (by any means, including plating, plasma spray, etc), followed by application of photoresist, expose, develop and etch removal of unwanted metal.

Figure 2:
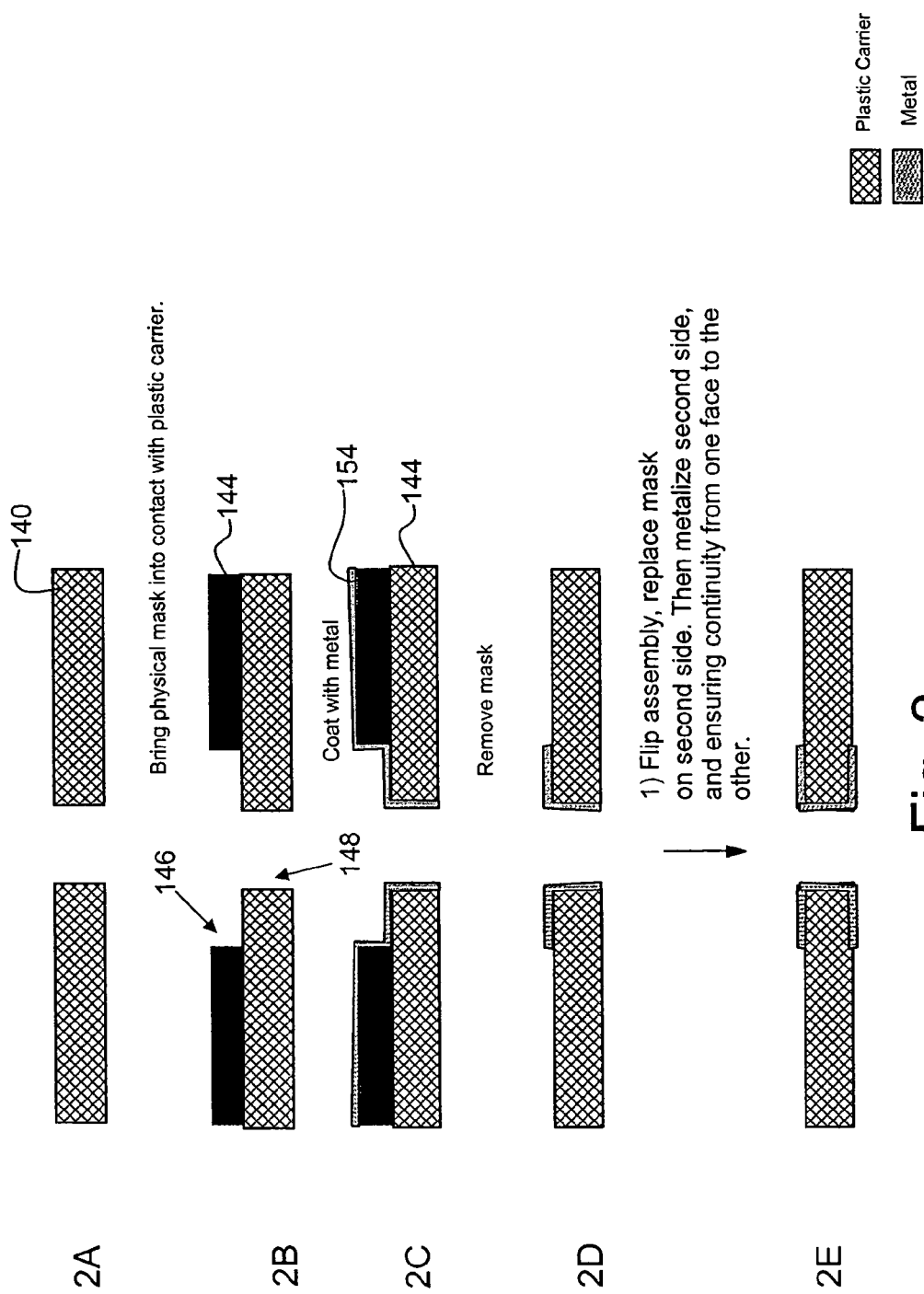
FIG. 2 is a diagram for a physical mask process flow for metallizing through holes in an interposer carrier of the method of the present invention.

Referring to FIG. 2, in the direct metallization approach, at steps 2A and 2B a physical mask 144 is oriented so that one or more openings 146 therein are aligned over one or more perforation holes 148 in carrier 140 and brought into contact with one another. Openings 146 may have any suitable shape, for example, circular, star, cross and other shapes. At step 2C, metal is deposited onto carrier 140 by such a method that a metal coating 154 will result on the open areas on top of carrier 140 and down onto the side walls of the hole or via 148. At step 2D, physical mask 144 is removed. Carrier 140 is then flipped over and the other side is metallized in similar fashion (e.g., steps 2A, 2B and 2C are repeated), thereby creating a continuous metal path from the top of carrier 140, down the sides of hole 148 and onto the other side of the carrier 140 as shown at step 2E and in FIGS. 8 and 9.

Figure 3:
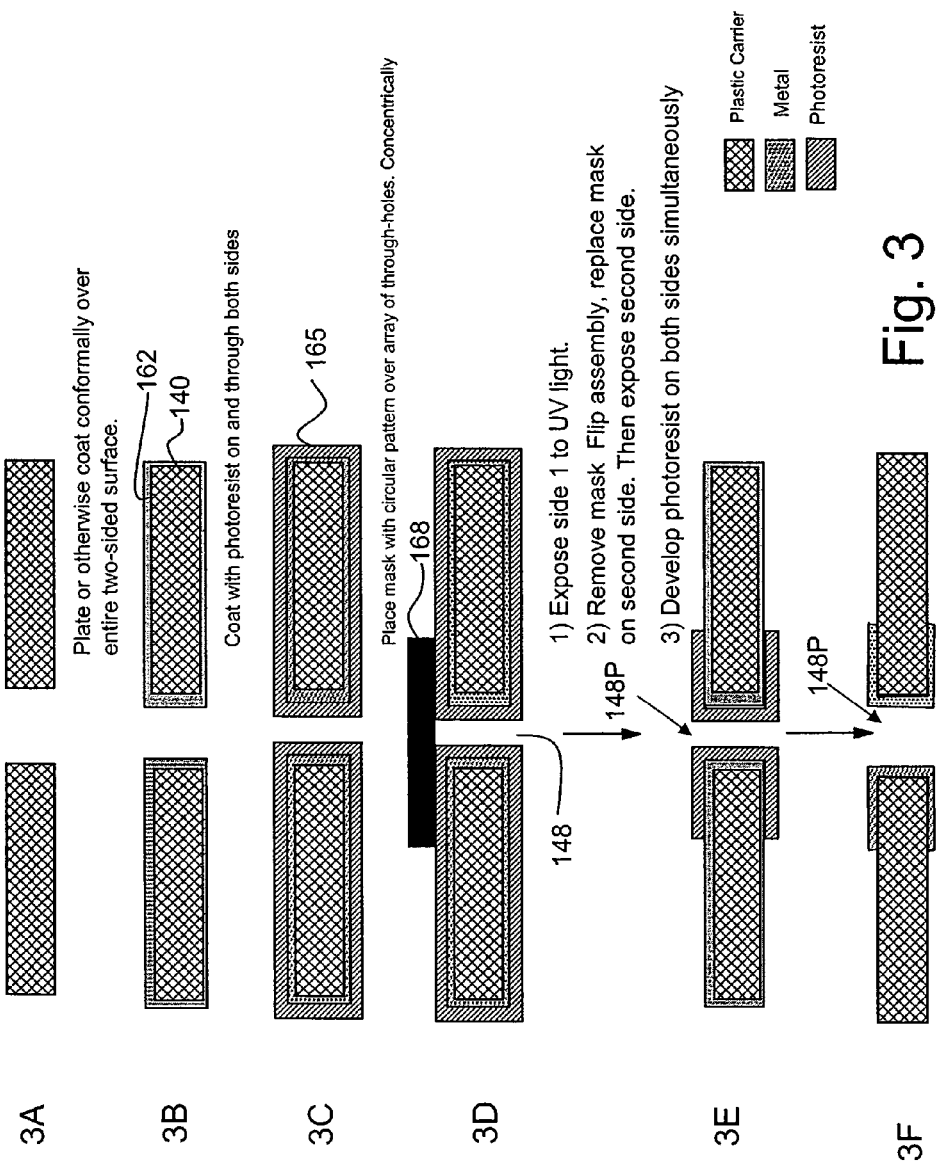
FIG. 3 is a diagram for an alternate photoresist process flow for metallizing through holes in an interposer carrier of the method of the present invention.

Referring to FIG. 3, the subtractive method for patterning the metal on carrier 140 is shown. The method begins at steps 3A and 3B by depositing a coating 162 of metal on both sides, as well as hole 148, of carrier 140. At step 3C. a coating 165 of photoresist is deposited over metallic coating 162. At step 3D, a mask 168 having circular patterns of a larger diameter than holes 148 is placed over each side of carrier 140 so that the circular patterns are concentrically aligned with and cover holes 148. One side of carrier 140 is then exposed to ultraviolet light. Mask 168 is then removed from this side. Carrier 140 is flipped. The second side is then exposed to ultraviolet light, the metal etched from the exposed areas and mask 168 is then removed from the second side. Metal is etched away from the exposed areas on both sides. At step 3E, photoresist coating 165 is developed on both sides simultaneously, thereby removing photoresist coating 165 to result in plated through hole 148P shown at step 3F.

It will be apparent to those skilled in the art that methods other than those shown in FIGS. 2 and 3, known currently or in the future, can be used to metallize holes 148.

Figure 4:
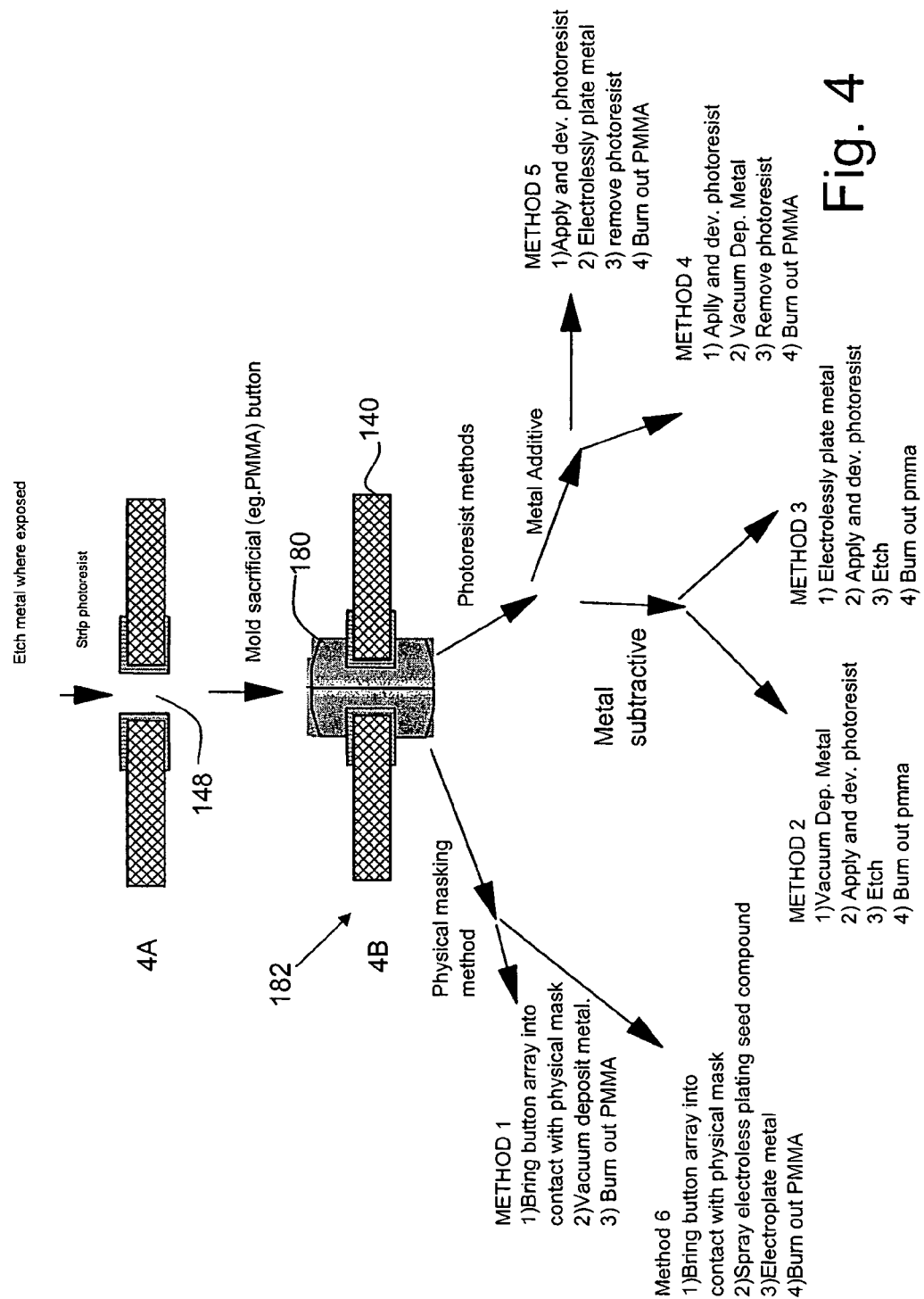
FIG. 4 is a diagram for a process flow of molding a sacrificial post into a premetallized LGA carrier and six alternate methods for completing fabrication of the LGA interposer array of the method of the present invention.
Figure 10:
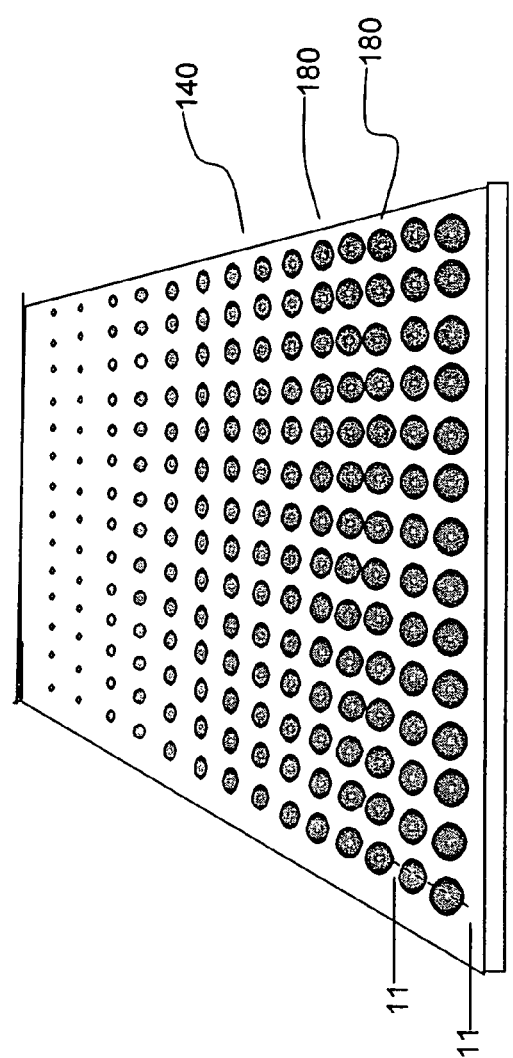
FIG. 10 is a perspective view of a carrier with a template of sacrificial posts in metallized through holes that is common to the six methods of FIG. 4.
Figure 11:
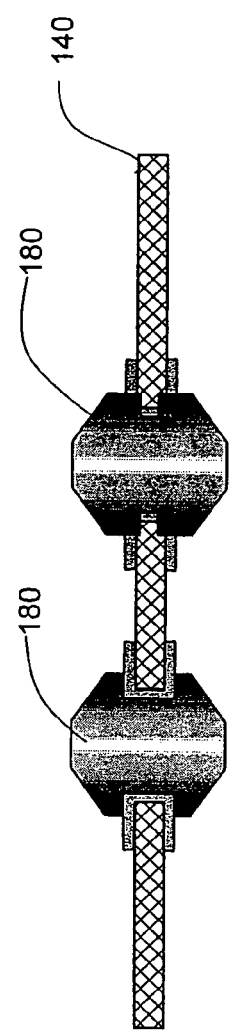
FIG. 11 is a cross-sectional view taken along line 11-11 of FIG. 10.
Figure 12:
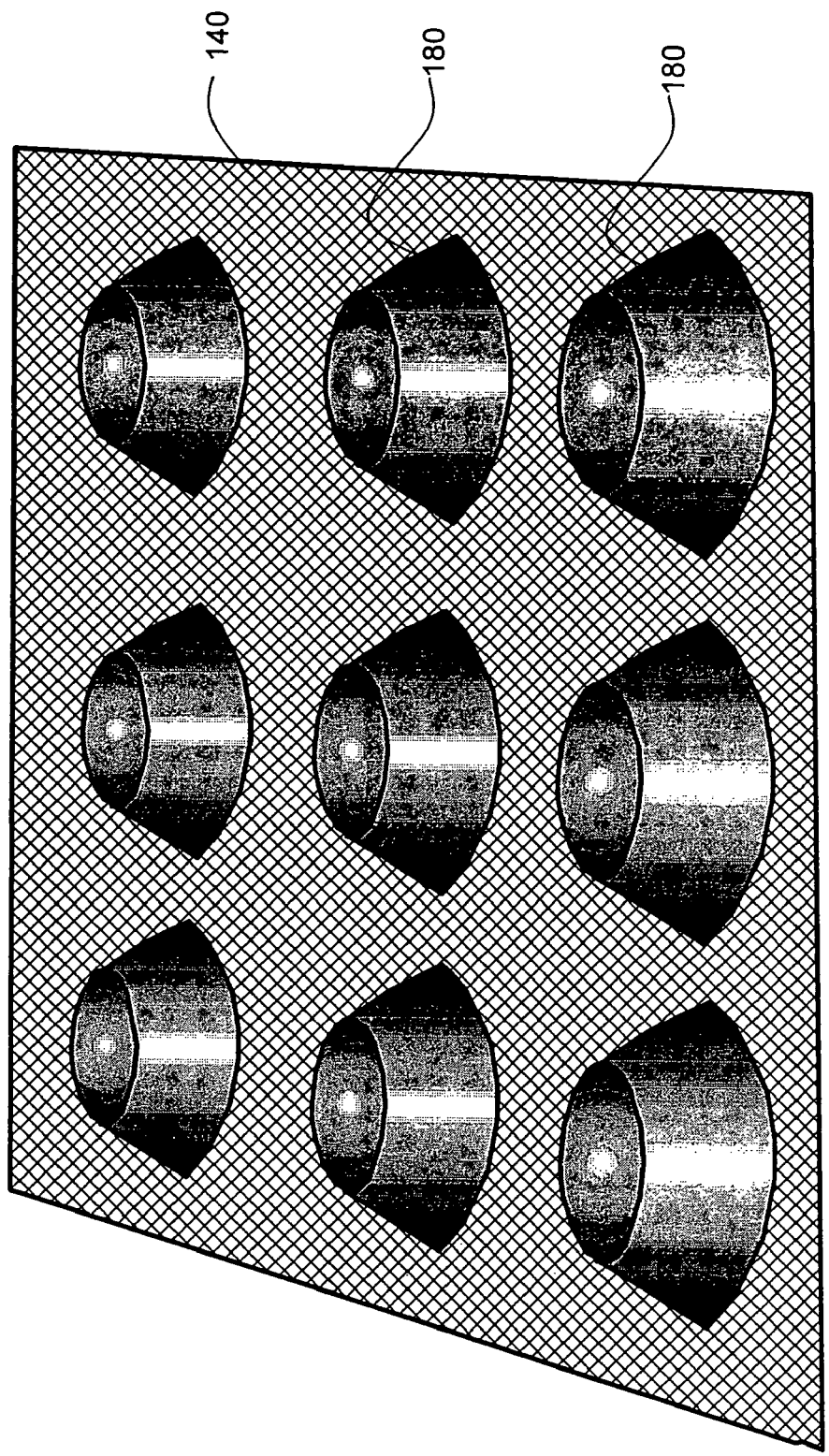
FIG. 12 is a perspective view of a carrier with a template of sacrificial posts that is common to all six methods.

Referring to FIG. 4, step 4A corresponds to step 3F. At step 4B sacrificial posts 180 are inserted into holes 148. Sacrificial posts 180 are formed in the shape of the final contacts, but will ultimately be removed after being used as a template for final metallization. Carrier 140 with sacrificial posts 180 installed is shown in FIGS. 10-12.

Sacrificial posts 180 can be formed in carrier 140 by any suitable method, for example by injection molding the full two-dimensional (2D) array at once. In other methods, sacrificial posts 180 may be prefabricated and then inserted into the holes instead. Nevertheless, sacrificial posts 180 will usually be made of a material that thermally decomposes and vaporizes.

For example, sacrificial posts 180 may be formed with a polymer, such as polymethylmethacrylate, polyalpha-methylstyrene, polyethyleneoxide, polyphenylene oxide or polystyrene. Indeed, most polymers under the right temperature conditions will thus decompose.

If carrier 140 is made of a thin ceramic material, instead of plastic used in the example, then higher temperature conditions for post decomposition could be employed and a great variety of materials used as the sacrificial post. Other options for the sacrificial posts are the use of solution dissolvable materials.

The next step is metallization over the sacrificial polymer contact button. This can be carried out in many ways. Six different methods are outlined in FIG. 4 and designated as methods 1 through 6, which will be described in detail hereinafter.

Once sacrificial posts 180 have been metallized, the next step is to heat the assembly to a temperature and under conditions such that sacrificial polymer posts 180 will depolymerize and vaporize or otherwise decompose and vaporize. This leaves a hollow metal cage structure that sometimes resembles a birdcage, examples of which are shown in FIG. 25.

Figure 13:
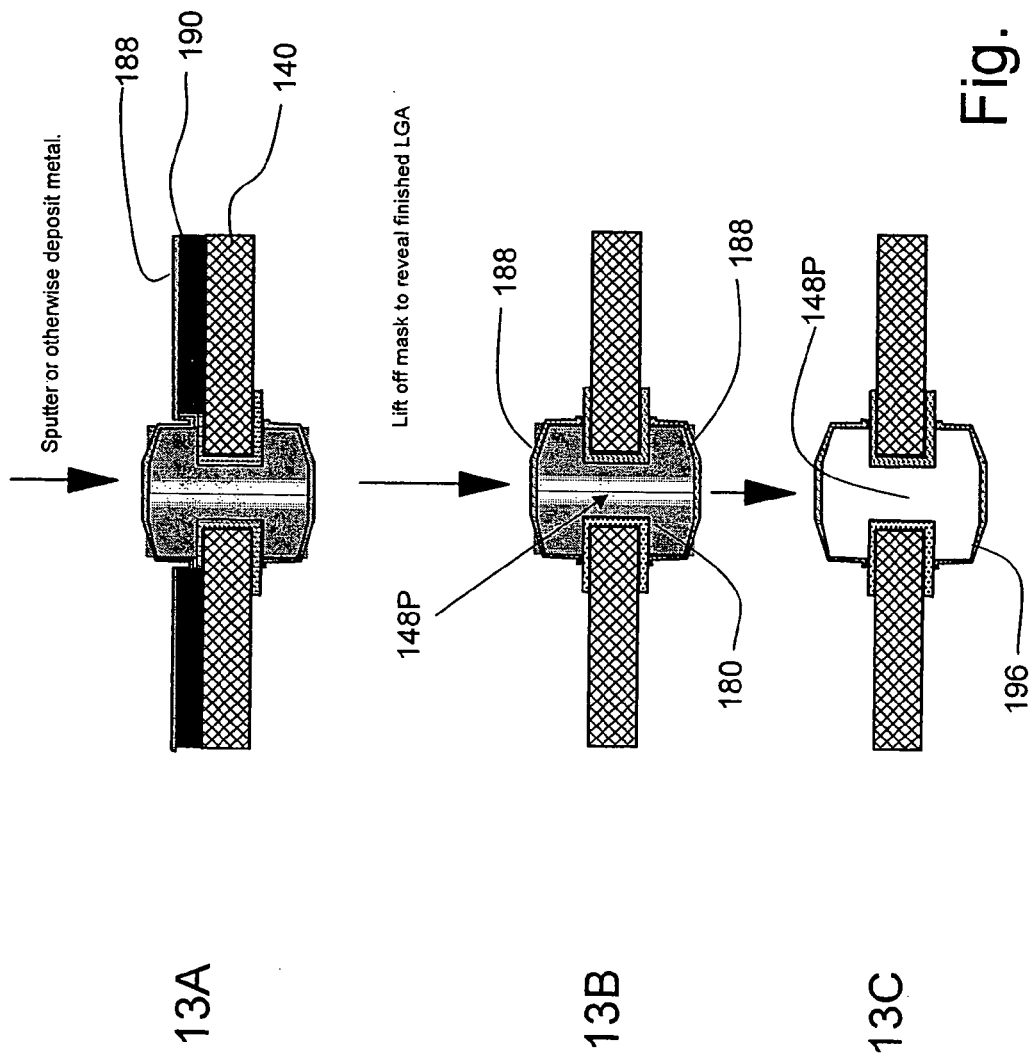
FIG. 13 is a process flow of method 1 of FIG. 4.

Referring to FIGS. 4 and 13, method 1 for metallizing sacrificial posts 180 begins at step 13A by depositing (as by sputtering, vacuum deposition or other suitable deposition technique) a metallic coat or film 188 on physical mask 190 that is disposed on carrier 140. Metallic coat 188 also covers any sacrificial posts 180 installed in carrier 140 plate. At step 13B, physical mask 190 is removed as by lifting, thereby leaving metallic coat 188 disposed on sacrificial posts 180 and in contact with plated through holes 148P. At step 13C, sacrificial posts 180 are decomposed, thereby leaving birdcage shaped contacts 196. Method 6 is identical to method 1, except that the metal coat is deposited by spraying with electroless plating seed compound and then electroplating the metal.

Figure 14:
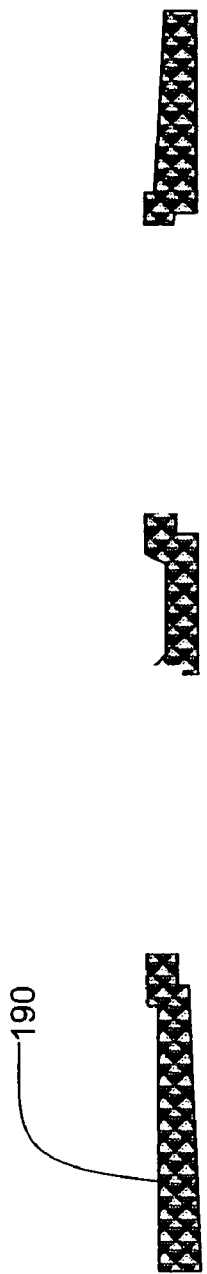
FIG. 14 is a cross-sectional view of a physical mask for yielding a full metallized shell button.
Figure 15:
FIG. 15 is a cross-sectional view of a physical mask for yielding a partially metallized shell button.

Referring to FIGS. 25 and 26, birdcage contacts 196 may have a variety of metallization patterns. The metallization patterns are shown before decomposition of sacrificial posts 26A through 26H in FIG. 25 (i.e., in unfinished form where the metal is still fixed on the sacrificial posts) and after decomposition in FIG. 26. These patterns are formed by differently shaped masks. For example, FIG. 14 shows a cross section of two contact positions of a physical mask 190 that are shaped to yield the metallization pattern shown at 25G of FIG. 25 and 26G of FIG. 26. FIG. 15 shows a cross section of two contact positions of a physical mask 190 that are shaped to yield the metallization pattern shown at 25A of FIG. 25 and 26A of FIG. 26. The physical masks illustrated in FIGS. 14 and 15 can be used for either method 1 or method 6. Other mask types, such as purely 2D masks like molybdenum masks can alternatively be used.

Figure 16:
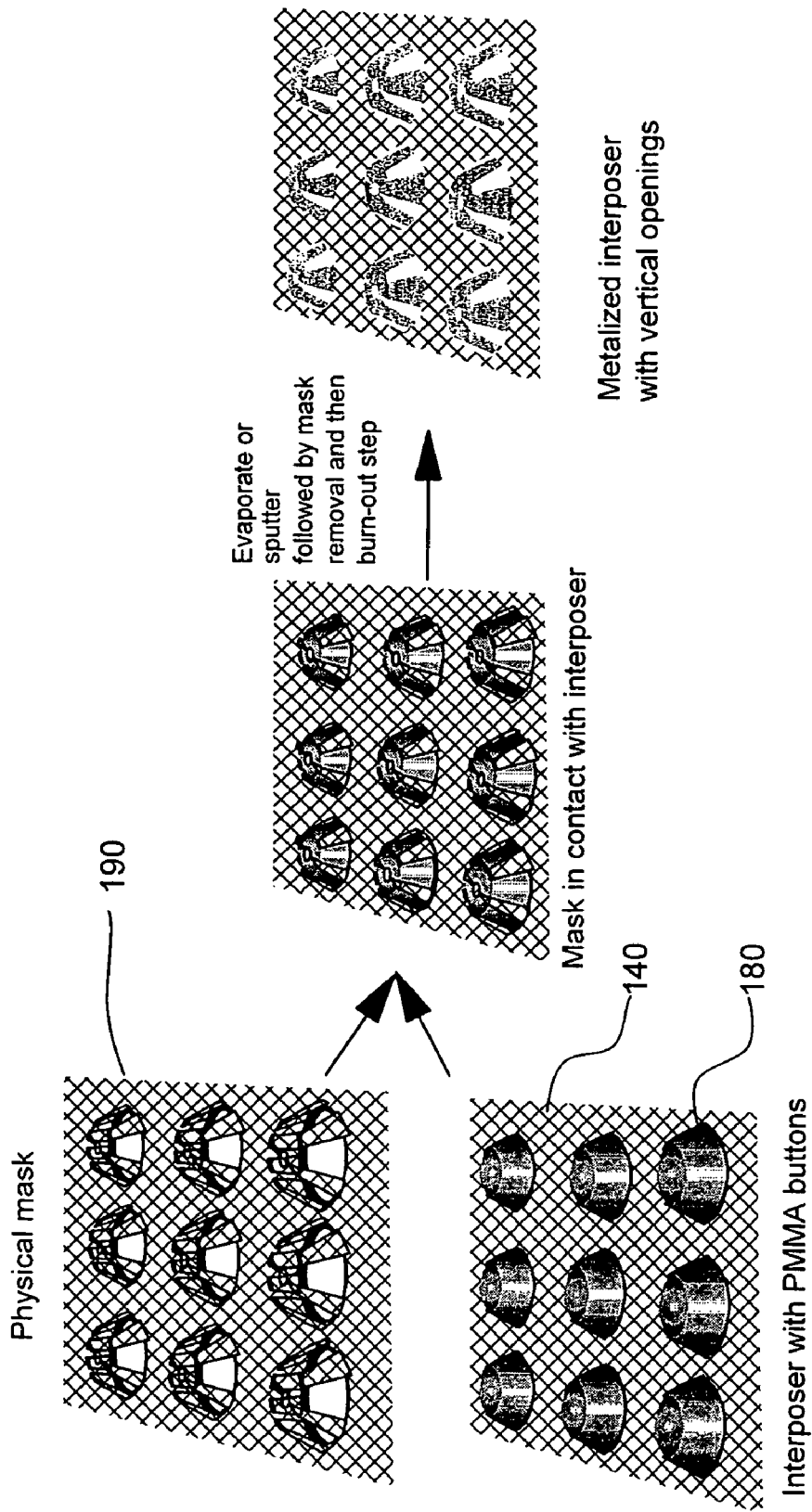
FIG. 16 is a diagram of the process flow of the methods 1 and 6 of FIG. 4.
Figure 17:
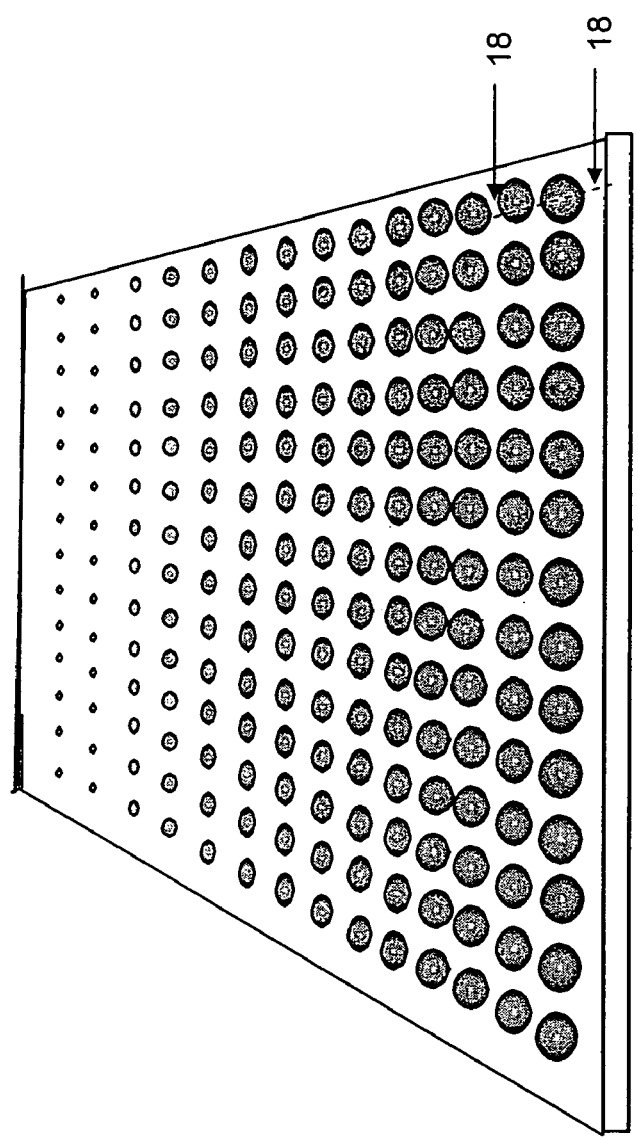
FIG. 17 is a perspective view of an interposer carrier before the sacrificial posts are removed.
Figure 18:
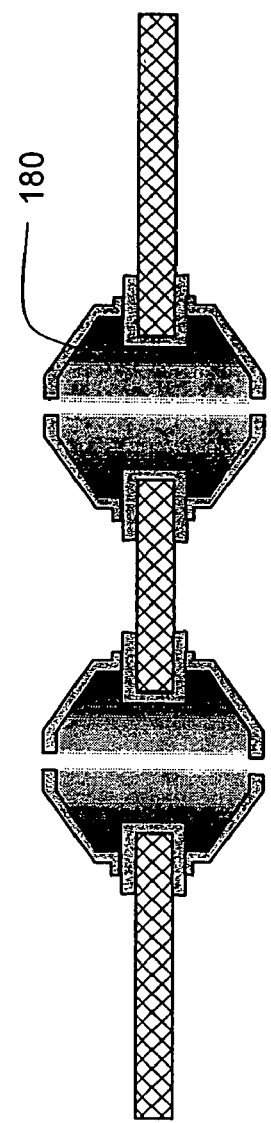
FIG. 18 is a cross-sectional view taken along line 18-18 of FIG. 17.
Figure 19:
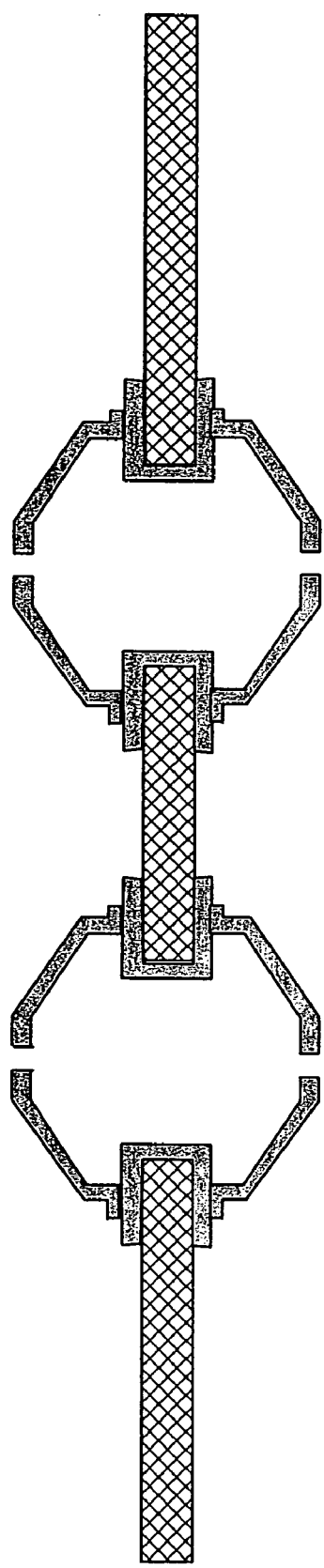
FIG. 19 is the cross-sectional view FIG. 18 with the sacrificial posts removed.
Figure 20:
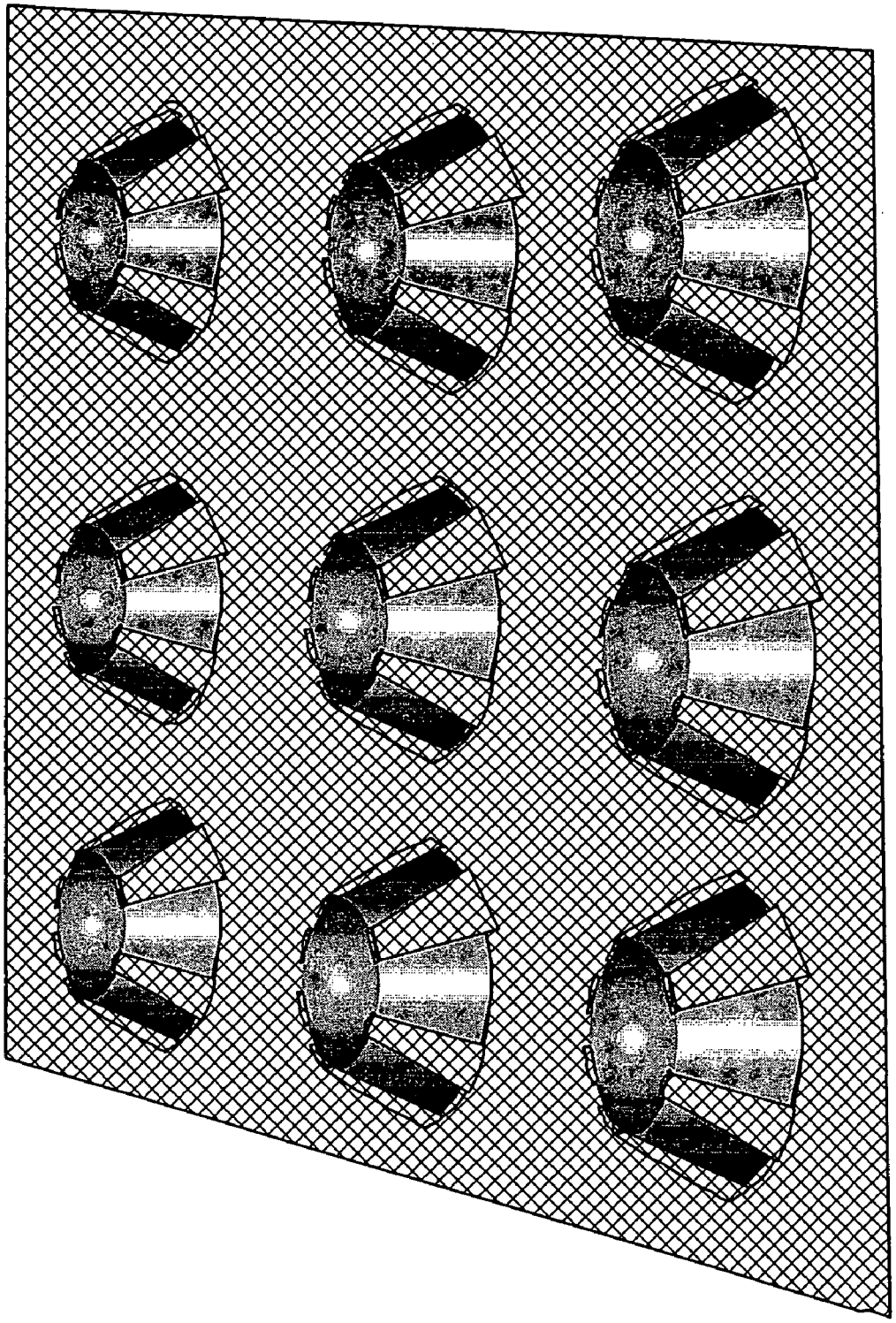
FIG. 20 is a perspective view of a carrier with unmetallized sacrificial posts docked into a physical mask.

Referring to FIG. 16, method 1 is further shown as bringing physical mask 190 and carrier 140 with installed sacrificial posts into contact with one another. Physical mask 190 has mask patterns that correspond to pattern 25H of FIG. 25 and 26H of FIG. 26. These patterns contain a hole to permit passage of light from a light source. FIGS. 17 and 18 also show the metallization pattern of 25H of FIG. 25 before decomposition of sacrificial posts 180. FIG. 19 shows the metallization pattern of 26H of FIG. 26 after decomposition of sacrificial posts 180. FIG. 20 shows a physical mask 190 that bears a mask pattern corresponding to the metallic pattern 26E of FIG. 26.

Figure 21:
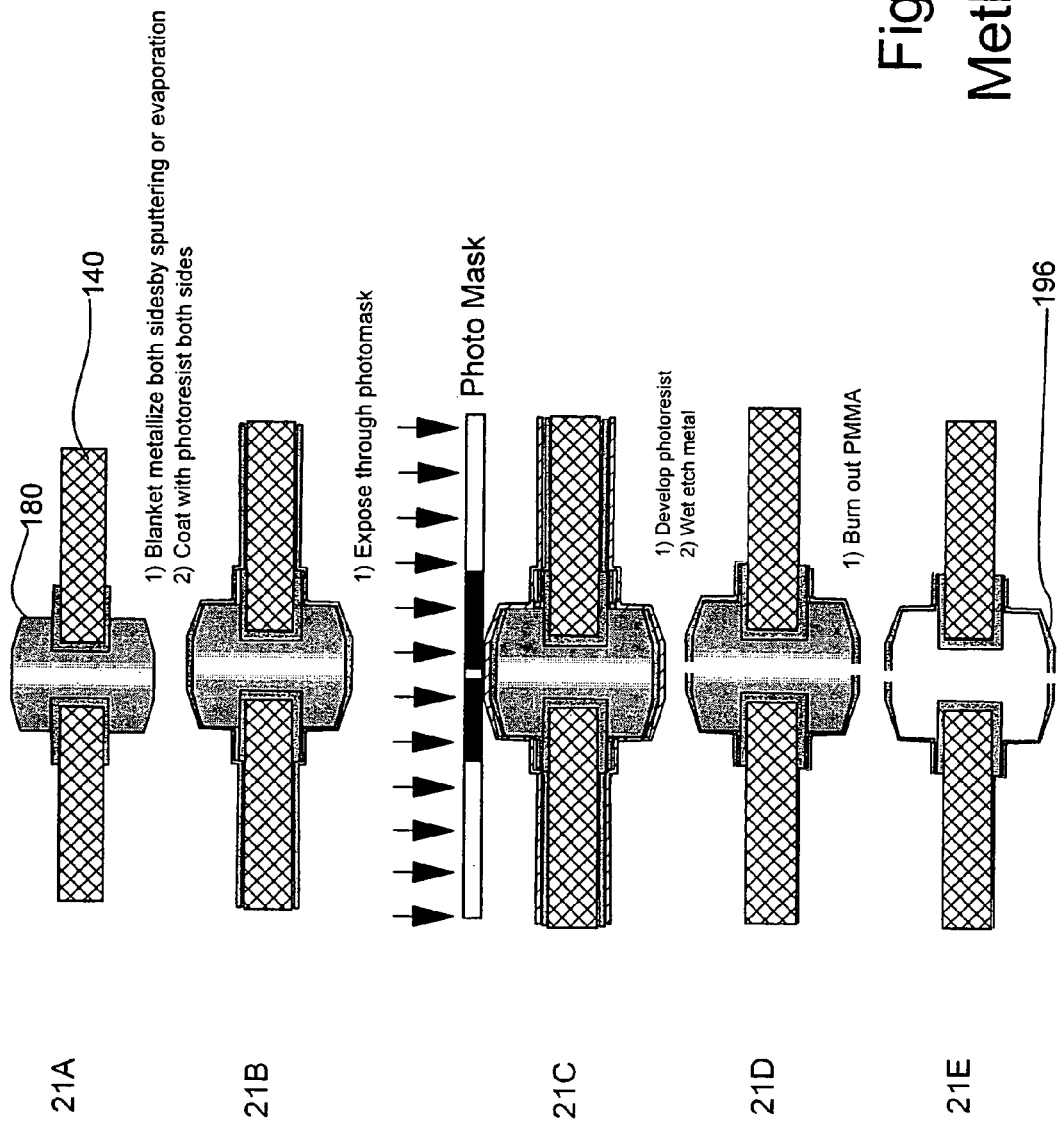
FIG. 21 is a diagram of the process flow of the method 2 of FIG. 4.

Referring to FIGS. 4 and 21, method 2 for metallizing carrier 140 with installed sacrificial posts 180 begins at steps 21A and 21B by blanket metallizing both sides of carrier 140 as by vacuum deposition (e.g., sputtering or evaporation). Then both sides are coated with photoresist. The photoresist is exposed to ultraviolet light through a photomask having the desired pattern of metallization at step 21C. The exposed photoresist area is developed and the masked areas are wet etched to remove metal at step 21D, thereby leaving the desired metallization pattern. The sacrificial posts 180 are then decomposed at step 21E, thereby leaving the desired birdcage contact 196.

Figure 22:
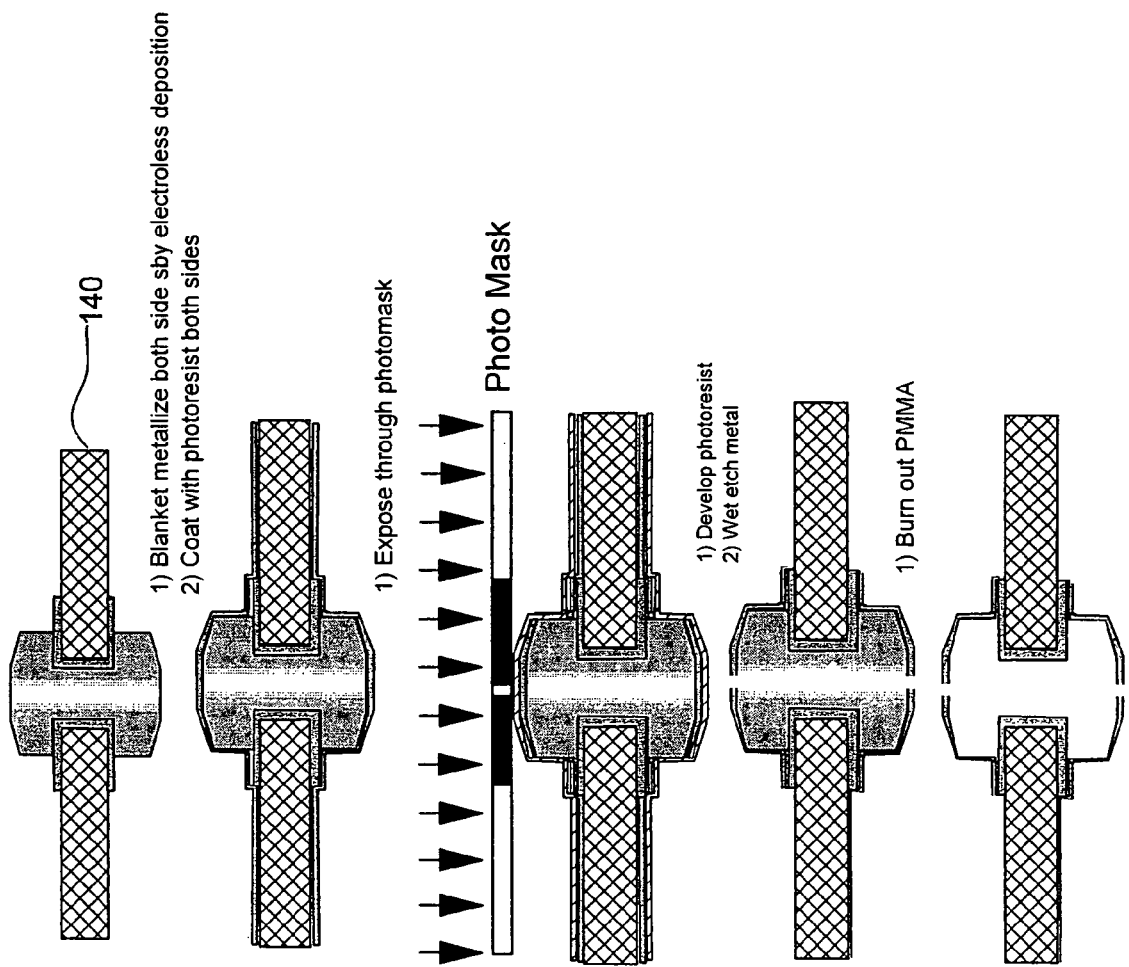
FIG. 22 is a diagram of the process flow of the method 3 of FIG. 4.

Referring to FIG. 22, method 3 is identical to method 2, except that the metal is deposited to both sides of carrier 140 by electroless deposition.

It should be apparent to those skilled in the art that other methods of depositing can be used, such as laminating foil or preformed sheet metal in a shape like an egg carton could be laminated and positioned in registry with the vias. In this embodiment, sacrificial posts may or may not be used.

Figure 23:
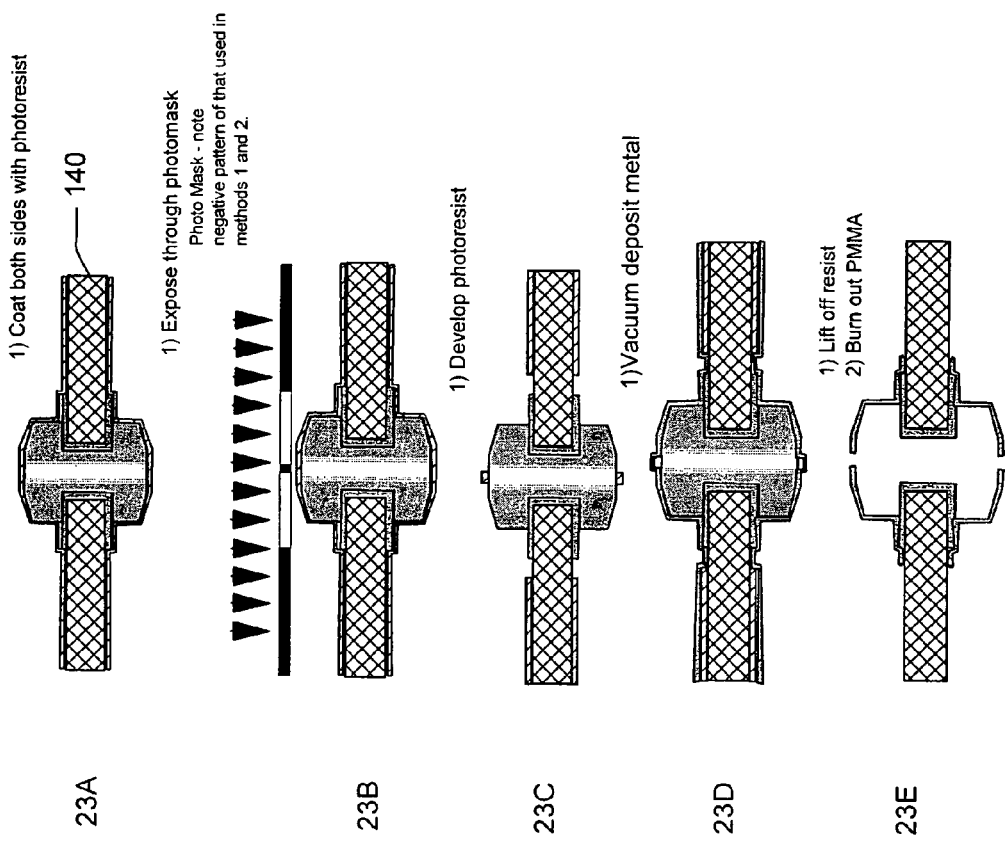
FIG. 23 is a diagram of the process flow of the method 4 of FIG. 4.

Referring to FIG. 23, method 4 uses a metal additive approach. Method 4 begins at step 23A by coating both sides of carrier 140 with photoresist. At step 23B, the photoresist is exposed to ultraviolet light through a photomask having a negative pattern to that of the photomask used in methods 2 and 3. The exposed areas of the photoresist are developed at step 23C. At step 23D, a metallic coat is vacuum deposited on both sides of carrier 140. At step 13E, the photoresist is lifted off carrier 140 and sacrificial posts 180 are decomposed, thereby leaving the birdcage contact 196.

Figure 24:
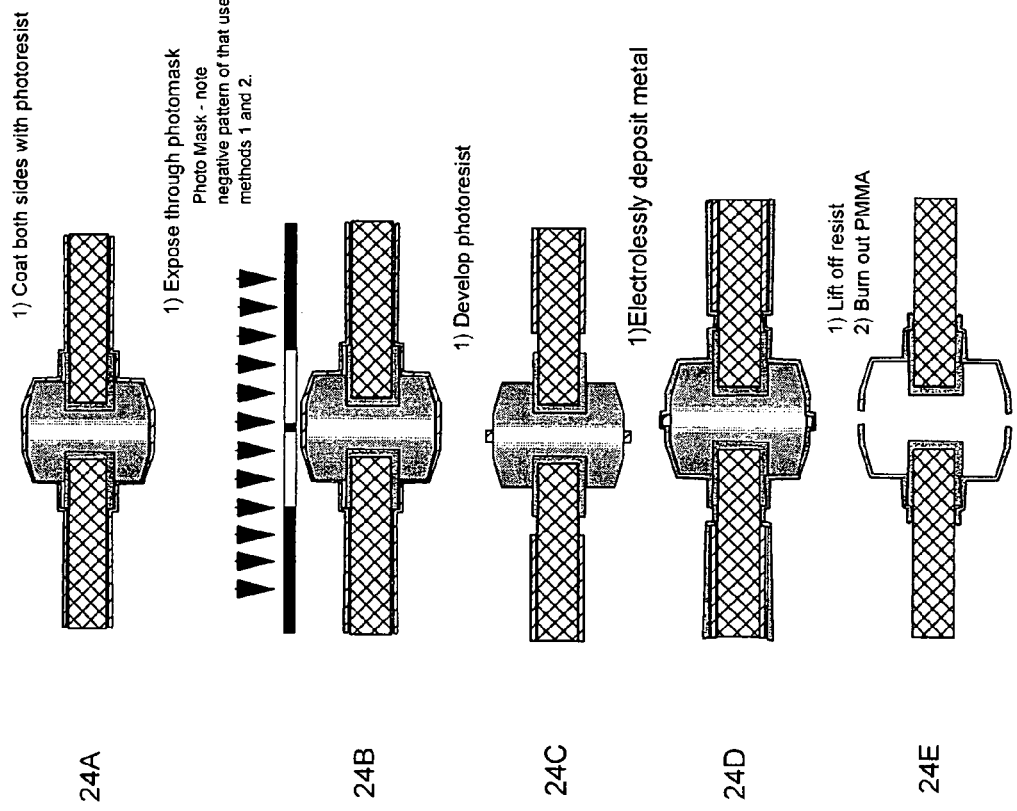
FIG. 24 is a diagram of the process flow of the method 5 of FIG. 4.

Referring to FIG. 24, method 5 is identical to method 4, except that the metal coat is deposited to both sides of carrier 140 by electroless deposition.

Many different birdcage patterns are envisioned. Those shown are only for illustration. The patterns can range from being fully metallized, to being only a fine lacy structure. Furthermore, the same interposer could have some posts with some patterns and other posts with different patterns to serve specialized functions.

One type of special function pattern includes a window through which an optical signal could pass as shown at 26H in FIG. 26. Thus, if the chip or chip module that the interposer were making contact with had a combination of electrical signals and optical signals, these could both be accommodated by the same birdcage contact type.

Methods other than methods 1 through 6 can be used to metallize the sacrificial posts. For example, an entire 2-D array of the metal pieces could be prefabricated and attached to the metallized planar substrate.

In still other embodiments, post shapes of different types can be used. Short and wide (relative to the post-to-post pitch, or tall and narrow would be two typical types. Other more specialized shapes might also be desirable. For instance if a great deal of vertical compressibility were desired in the final metal contact, one could fabricate the sacrificial posts to have a 3-D shape with accordion like serrations. These serrations, once metallized, and the posts burned away, would provide accordion like compressibility while minimizing metal fatigue.

In another embodiment, the button could be fabricated as a cylinder having slots parallel to the cylinder axis so as to make bending more difficult without significantly reducing compressibility along the cylindrical axis.

Different metals can be used to achieve the optimum performance of the button. Common metals used in microelectronic fabrication, such as copper, nickel, gold, chromium, titanium, lead, tin, bismuth or antimony are applicable as well as other less common materials that may be used for greater metal fatigue toughness, such as nickel/iron alloys, beryllium copper, nickel/titanium alloys or metals for low thermal expansion, such as tungsten or molybdenum.

The present invention having been thus described with particular reference to the preferred forms thereof, it will be obvious that various changes and modifications may be made therein without departing from the spirit and scope of the present invention as defined in the appended claims.

What is claimed is:

1. A method for fabricating an electrical contact button comprising:
    forming a sacrificial post in a perforation of a carrier by injection molding a material in said perforation, wherein said material thermally decomposes and vaporizes;
    extending said sacrificial post with a top portion beyond a top surface of said carrier and a bottom portion beyond a bottom surface of said carrier;
    forming a pattern of electrically conductive material on both said top portion and bottom portion of said sacrificial post; and
    removing said sacrificial post, thereby providing said electrical contact button.

2. The method of claim 1, wherein said electrically conductive material is selected from the group consisting of: copper, nickel, gold, chromium, titanium, lead, tin, bismuth, antimony, tungsten, molybdenum and alloys thereof.

3. The method of claim 1, wherein said pattern of electrically conductive material is formed on said sacrificial post by a process selected from the group that consists of: physical masking and photoresist.

4. The method of claim 3, wherein said physical masking process is selected from the group that consists of: vacuum deposition and electroless plating.

5. The method of claim 3, wherein said photoresist process is selected from the group consisting of: metal additive and metal subtractive.

6. The method of claim 3, wherein said photoresist process is selected from the group that consists of: vacuum deposition, sputtering, electroless plating, laminating foil and preformed sheet metal.

7. The method of claim 1, wherein said sacrificial post material is a polymer.

8. The method of claim 1, wherein said sacrificial post material is selected from the group consisting of: polymethylmethacrylate, polyalpha-methylstyrene, polyethyleneoxide, polyphenylene oxide and polystyrene.

9. The method of claim 1, wherein said pattern is selected from the group consisting of: continuous and non-continuous.

10. The method of claim 1, wherein said carrier is formed of an electrically insulating material.

11. The method of claim 10, wherein said electrically insulating material is selected from the group consisting of: polyimide, polyester, ceramic, quartz, glass, polymer coated metal, polytetrafluoroethylene and oxides.

12. The method of claim 10, wherein said carrier includes a plurality of said perforations in which a plurality of said sacrificial posts are formed by injection molding, wherein a pattern of said electrically conductive material is formed on each of said sacrificial posts, and wherein said sacrificial posts are removed to thereby form a plurality of electrical contact buttons.

13. The method of claim 12, wherein a coating of electrically conductive material is formed on at least one of said perforations before said sacrificial posts are formed.

14. The method of claim 12, wherein said electrically conductive material is selected from the group consisting of: copper, gold, nickel, titanium, and alloys thereof.

15. The method of claim 12, wherein said pattern of electrically conductive material is formed on said sacrificial posts by a process selected from the group consisting of: physical masking and photoresist.

16. The method of claim 15, wherein said physical masking process is selected from the group consisting of: vacuum deposition and electroless plating.

17. The method of claim 15, wherein said photoresist process is selected from the group consisting of: metal additive and metal subtractive.

18. The method of claim 15, wherein said photoresist process is selected from the group consisting of: vacuum deposition, sputtering electroless plating, laminating foil and preformed sheet metal.

19. The method of claim 12, wherein said pattern is selected from the group consisting of: continuous and non-continuous.

20. The method of claim 10, wherein said electrically insulating material is selected from the group that consists of: polyimide, polyester, ceramic, quartz, glass, polymer coated metal and polytetrafluoroethylene, oxides.

21. The method of claim 1, further comprising:
forming a metallic coating on a side wall of said perforation, thereby forming a metallic plated through perforation, and wherein said sacrificial post is formed in said metallic plated through perforation.

* * * * *